United States Patent

Schumacher et al.

[11] Patent Number: 5,940,547
[45] Date of Patent: Aug. 17, 1999

[54] OPTICAL FIBER ACCIDENTAL ARC DETECTOR FOR AN ELECTRIC POWER DISTRIBUTION SWITCHING DEVICE

[75] Inventors: Andreas Schumacher, Dattenberg; Ferenc Boros, Neunkirchen-Seelscheid, both of Germany

[73] Assignee: Klöckner-Moeller GmbH, Bonn, Germany

[21] Appl. No.: 08/939,903

[22] Filed: Sep. 29, 1997

Related U.S. Application Data

[63] Continuation of application No. PCT/DE96/00543, Mar. 28, 1996.

[30] Foreign Application Priority Data

Mar. 30, 1995 [DE] Germany ................. 295 05 362 U

[51] Int. Cl.⁶ .................. G02B 6/00; G01J 1/04
[52] U.S. Cl. .................. 385/12; 385/147; 250/227.11; 250/227.14
[58] Field of Search .................. 385/12, 147, 88; 250/227.11, 227.14, 227.18; 356/313

[56] References Cited

U.S. PATENT DOCUMENTS

| | | |
|---|---|---|
| 4,377,086 | 3/1983 | Linder et al. .................. 385/12 X |
| 4,702,553 | 10/1987 | Buchmuller et al. .................. 385/12 X |
| 4,988,861 | 1/1991 | Hakoun et al. .................. 250/227.11 |
| 5,048,914 | 9/1991 | Sneddon .................. 385/24 X |
| 5,446,279 | 8/1995 | Hsu .................. 250/227.21 |
| 5,452,087 | 9/1995 | Taylor et al. .................. 385/12 X |
| 5,714,680 | 2/1998 | Taylor et al. .................. 385/12 X |

FOREIGN PATENT DOCUMENTS

| | | | |
|---|---|---|---|
| 0063506 | 10/1982 | European Pat. Off. .................. 385/12 X |
| 271397 | 8/1989 | Germany .................. 385/12 X |
| 4331716 | 3/1994 | Germany .................. 385/12 X |
| 8808217 | 10/1988 | WIPO .................. 385/12 X |

*Primary Examiner*—Brian Healy
*Attorney, Agent, or Firm*—Nils H. Ljungman & Associates

[57] ABSTRACT

An electric power distribution switching device including a detector for detecting accidental arcs in the electric power distribution switching device, which detector includes at least one waveguide in which the light generated by the arc and reaching it via its casing is used as a triggering or warning criterion. The detector can include a support rod, a waveguide wound helically around the support rod, and two plug connectors fitted at the ends of the support rod. The detector also includes a heat-shrink sleeve which is permeable to light and UV radiation. The heat-shrink sleeve is fitted over the support rod, the waveguide and the plug connectors. A detector configured in this manner can prevent damage to the detector during installation or fitting in the switching equipment.

20 Claims, 2 Drawing Sheets

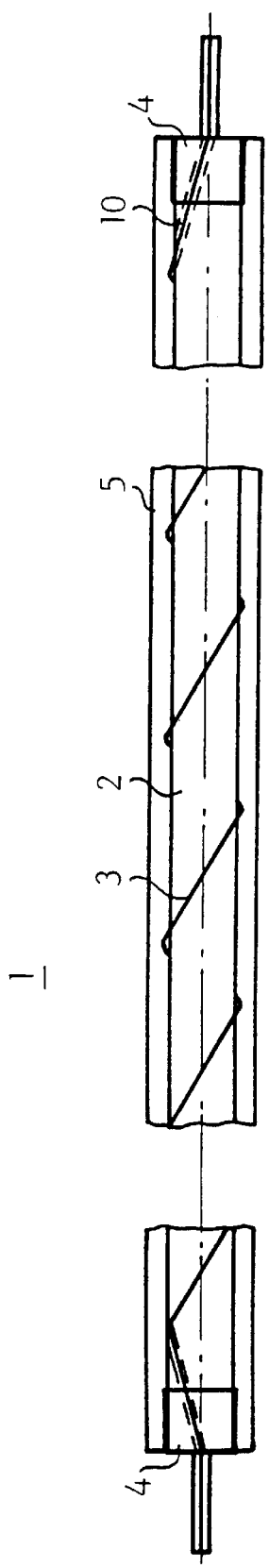
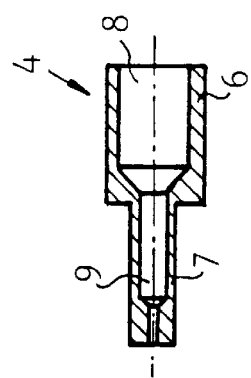
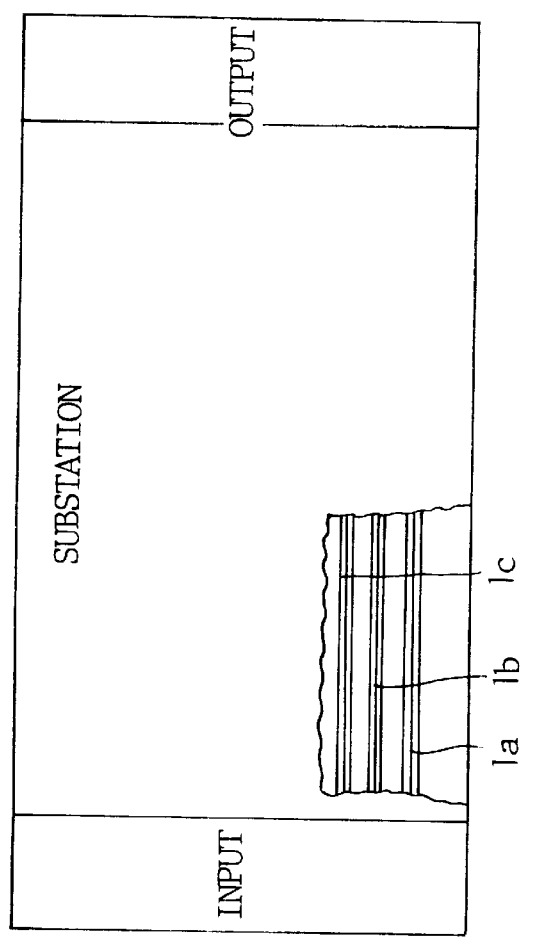
Fig.1
Fig.1A
Fig.2

OPTICAL FIBER ACCIDENTAL ARC DETECTOR FOR AN ELECTRIC POWER DISTRIBUTION SWITCHING DEVICE

This application is a continuation of PCT/DE96/00543 filed Mar. 28, 1996.

BACKGROUND OF THE INVENTION

1. Field of the Invention

The present invention generally relates to an electric power distribution switching device and an accidental arc detector for detecting accidental arcs in the electric power distribution switching device. The detector includes at least one optical waveguide, which optical waveguide is located in the vicinity of live parts, and in which the light generated by an accidental arc and reaching the optical waveguide radially via its casing acts as a triggering or warning criterion.

2. Background Information

DD 271 397 A1 describes an optical waveguide or light guide accidental arc detector, which optical waveguide is located in the vicinity of power supply buses without any special mountings. FIG. 2 of this publication shows the optical waveguide accidental arc detector in contact against both narrow sides of a bus bar which has a rectangular cross section. However, this publication does not indicate in any additional detail how the optical waveguide can be fastened to the bus bar. In FIG. 3 of the above-referenced publication, the optical waveguide is wound around the bus bar. In this arrangement, there is a danger that the optical waveguide can break, in particular at the points of contact with the corners of the bus bar, or in the areas near these corners. This arrangement also results in a severe restriction of the bonding surface of the bus bar.

There are also disadvantages to a direct surface mounting of the optical waveguide, as described in further detail in DE 43 31 716 A1. This publication also illustrates and describes various arrangements of an optical waveguide accidental arc detector.

FIG. 1 shows an arrangement in which the optical waveguide is oriented essentially vertically and is wound around the three bus bars. Disadvantages of this arrangement are that the distance from the point of origin of an accidental arc can be different, and that the accidental arc does not always occur in the vicinity of the detector.

With the meandering orientation illustrated in FIG. 3, of course, the latter phenomenon cannot occur, but there is always a danger, as with all other orientations, that the relatively thin and barely visible optical waveguide may be damaged during installation or other activities.

The invention also teaches that the optical fibers are located on bulkheads and other flat contact surfaces in the vicinity of the bus bar, in which case the optical waveguide can be fastened by means of adhesive or by fastening elements such as fastening lugs or spacers.

One problem with this arrangement is that bulkheads or similar elements are not always located close enough.

OBJECT OF THE INVENTION

The object of the present invention is therefore to create a detector which makes it possible to lay the optical waveguide in electrical switching equipment so that the optical waveguide is protected against breaking and/or damage.

SUMMARY OF THE INVENTION

The present invention teaches that this object can be achieved by providing a support rod and an optical waveguide which is wound helically around the support rod. Further, there can be two plug connectors for connection to optoelectronic components, which plug connectors can be located at the ends of the support rod. The detector also includes a heat-shrink sleeve which is permeable to light and to UV radiation, which sleeve is fitted over the support rod, the optical waveguide and the plug connectors.

The present invention teaches that it is easily possible to protect the optical waveguides, and that unexpectedly, there is no significant adverse effect on the optical characteristics of the detector.

The plug connectors can each include a first part and a second part. On one end, the first part can preferably have a cavity into which cavity the end of the support rod can be introduced. Near the other or outer end of the first part, there can be a second part, which second part is provided with a diameter which is significantly smaller than the first part. The second part can have a cavity, which cavity tapers toward the end to a diameter which is approximately equal to the diameter of the optical waveguide.

In addition, the optical waveguide can be guided in the vicinity of the plug connector through a boring, which boring extends diagonally from the outer surface to the center of the support rod, so that on the end, the optical waveguide extends parallel to, and is centered in relation to the support rod.

In other words, and in accordance with one embodiment, the boring can extend at an angle from the outer surface of the support rod to the center of the support rod, and the optical waveguide can extend into this boring so that the optical waveguide is centered with respect to the second part of the plug connector.

Further, the support rod, in accordance with one embodiment, can be flexible.

When the word "invention" is used in this specification, the word "invention" includes "inventions", that is, the plural of "invention". By stating "invention", the Applicants do not in any way admit that the present application does not include more than one patentably and non-obviously distinct invention, and maintains that this application may include more than one patentably and non-obviously distinct invention. The Applicants hereby assert that the disclosure of this application may include more than one invention, and, in the event that there is more than one invention, that these inventions may be patentable and non-obvious one with respect to the other.

BRIEF DESCRIPTION OF THE DRAWINGS

The invention, additional embodiments and improvements to the invention and additional advantages are described and explained in greater detail below with reference to the accompanying drawings, in which:

FIG. 1A shows a substation including bus bars;

FIG. 1 is an illustration of the detector;

FIG. 2 is an illustration of the plug connector; and

DESCRIPTION OF THE PREFERRED EMBODIMENT

Figure 3:
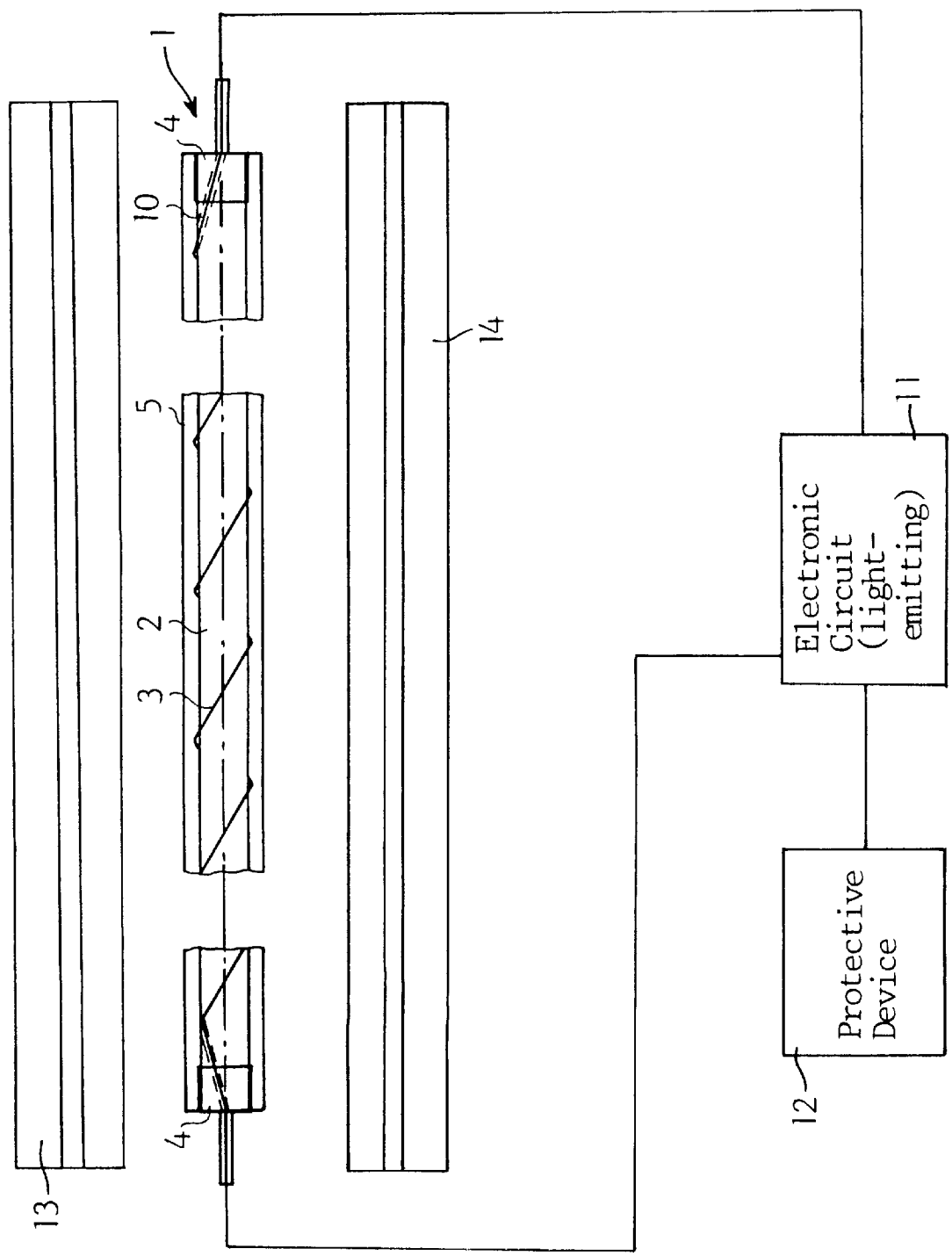
FIG. 3 shows an embodiment of the detector and two bus bars.

FIG. 1A shows a substation having an input and an output. The substation shown in FIG. 1A also includes bus bars 1a, 1b and 1c, with which the present invention may be utilized, as discussed further below.

FIG. 1 shows the detector 1. The detector 1 includes a flexible support rod 2, which support rod 2 preferably has a diameter of approximately 4 mm. An optical waveguide or light guide 3 is wound in a spiral fashion around the support rod 2, and two plug connectors 4 are located on the ends of the support rod 2 for connection to optoelectronic elements. The detector 1 also includes a heat-shrink sleeve 5, which sleeve 5 is permeable to light and UV radiation, and which sleeve 5 is fitted over the support rod 2, the optical waveguide 3 and the plug connectors 4.

The heat-shrink sleeve 5, before installation, can have a diameter which is larger than the diameter of the support rod 2. When heat is applied, the diameter of the heat-shrink sleeve 5 decreases so that the optical waveguide 3, which optical waveguide 3 is located between the support rod 2 and the shrink-fitted sleeve 5, is clamped in position.

In this manner, the optical waveguide 3 is protected against mechanical damage. The surface of the optical waveguide 3 is also protected from dirt. The dirt collects on the surface of the heat-shrink sleeve 5 instead of on the optical waveguide 3.

In accordance with one embodiment of the present invention, the sleeve 5, after being shrink-fitted around the optical waveguide 3, the support rod 2 and plug connectors 4, can preferably serve to correctly position the optical waveguide 3 around the support rod 2. In addition, the support rod 2 can preferably be flexible, which can simplify installation of the support rod 2. In this regard, the flexible nature of the support rod 2 can allow the detector to be installed in tight spaces. In addition, the flexibility of the support rod 2 can also permit the detector 1 to be placed in fixed mounts without the need for adjusting or moving the mounts during the installation process.

In accordance with one embodiment of the present invention, the heat-shrink sleeve 5 can be perforated over its entire length.

The two plug connectors 4 can each include a first part 6 and a second part 7. The first part 6 has a cavity 8 into which cavity 8 the end of the support rod 2 can be introduced. The diameter of the rotationally symmetrical first part 6 can preferably be approximately 2 mm larger than the diameter of the support rod 2. The inside diameter of the cavity 8 can be about 4.2 mm, so that the support rod 2 can be introduced with a clearance of about 0.2 mm.

The second, also rotationally symmetrical part 7 located on the outer end of the plug, connector 4 is provided with a diameter which is significantly smaller than the diameter of the first part 6. This diameter is a function of the size of the socket of an optical coupling device connection. In accordance with one embodiment of the present invention, the diameter of the second part 7 can possibly vary depending upon the particular size of the socket of the optical coupling device connector.

The second part 7 can preferably have a cavity 9 disposed therein. The cavity 9 of the second part 7 can taper toward the end to a diameter of approximately 0.3 mm, i.e. approximately the diameter of the optical waveguide 3. In accordance with one embodiment, the optical waveguide 3 can extend into the cavity 9 of the second part 7.

In the vicinity of the plug connector 4, the optical fiber is guided through a boring 10 which extends diagonally from the outside surface to the center of the support rod 2, so that on the end, the optical waveguide 3 extends parallel to and is centered in relation to the support rod 2.

In other words, and in accordance with one embodiment of the present invention, the optical fiber of the optical waveguide 3 can extend through a boring 10 located in the support rod 2, which boring 10 can extend at an angle from the outer surface of the support rod 2 to the center of the support rod 2. Therefore, the optical fiber of the optical waveguide 3 can also be centered with respect to the cavity 9 of the second part 7 of the plug connector 4.

FIG. 3 shows an additional embodiment of the present invention, wherein the detector 1 is located adjacent two parallel bus bars 13 and 14. In accordance with this embodiment the detector 1 can be located behind the bus bars 13, 14, in front of the bus bars 13, 14, or possibly between the bus bars 13, 14. As shown in FIG. 3, the detector 1 can be connected (shown schematically only) by means of the plug connectors 4 to an optoelectronic component such as an electronic circuit 11. The electronic circuit 11 can include a light-emitting diode which emits a constant light beam of a defined wavelength at the beginning of the optical waveguide or optical fiber conductor 3. The electronic circuit 11 can also have a receiver at the end of the optical waveguide 3. If an arcing fault develops in the bus bar compartment, the light from the arc is injected into, or interferes with, the optical waveguide 3. This additional light raises the level of light received by an evaluation circuit. The electronic circuit 11 can preferably generate a voltage which is proportional to the level of light. After a specified level is exceeded, which level can be set by means of the evaluation circuit, a signal can be generated which can be used, in accordance with one embodiment, by a protective device 12 to deactivate the portion of the substation in which the arcing fault is occurring.

In accordance with one embodiment of the present invention, the detector 1 of the present invention can be located within a substation including bus bars, or other components which generate arcing faults. Thus, the embodiment shown in FIG. 3 is presented only as an example of one type of use of the detector 1.

In accordance with one embodiment, the detector 1 can be mounted by means of the plug connectors 4 to optoelectronic components within the substation, which optoelectronic components can preferably be located in an optimum position for detecting arcing faults. For example, the substation can preferably have mounts designed to receive the plug connectors 4, wherein the mounts are positioned so as to place the detector 1 in the vicinity of bus bars or other electrically live components capable of generating accidental arcs. Each of the mounts can have an optical fiber conductor to direct and carry light to and/or from the optical fiber conductor or optical waveguide 3, of the detector 1. The optical fiber conductor of each of the mounts would essentially allow the detector 1 to be connected optically to the electronic circuit 11 shown in FIG. 3. The exact position of the mounts would vary depending on the desired position of the detector 1, which position would preferably optimize the detection of arcs. For example, the detector 1 could be disposed adjacent bus bars which have a high risk of generating inadvertent arcs.

One feature of the invention resides broadly in the detector for accidental arcs in electric power distribution switching equipment, whereby the detector includes at least one optical waveguide in which the light generated by an accidental arc and reaching it radially via its casing is used as a triggering or warning criterion, whereby in addition the optical waveguide is located in the vicinity of live parts, characterized by the fact that the detector 1 includes a support rod 2, an optical waveguide 3 wound helically around the support rod 2, two plug connectors 4 located at the ends of the support rod 2 for connection to optoelectronic components, and that the detector 1 also includes a heat-shrink sleeve 5 which is permeable to light and to UV radiation and is fitted over the support rod 2, the optical waveguide 3 and the plug connectors 4.

Another feature of the invention resides broadly in the detector characterized by the fact that the plug connectors 4 each include a first part 6 and a second part 7, that the first part 6 has a cavity 8 into which the end of the support rod 2 can be introduced, that on the outer end there is a second part 7 which is provided with a diameter which is significantly smaller than the first part 6, and that the cavity 9 of the second part tapers toward the end to a diameter which is approximately equal to the diameter of the optical waveguide 3.

Yet another feature of the invention resides broadly in the detector characterized by the fact that the optical waveguide 3 is guided in the vicinity of the plug connector 4 through a boring 10 which runs diagonally from the outer surface to the center of the support rod 2, so that on the end, the optical waveguide 3 runs parallel to and is centered in relation to the support rod 2.

Still another feature of the invention resides broadly in the detector characterized by the fact that the optical waveguide 3 is guided in the vicinity of the plug connector 4 through a boring 10 which runs diagonally from the outer surface to the center of the support rod 2, so that on the end, the optical waveguide 3 runs parallel to and is centered in relation to the plug connector 4.

Yet another feature of the invention resides broadly in the detector characterized by the fact that the support rod 2 is flexible.

Examples of switchboards and measurement devices which may be used in conjunction with the present invention can be found in the following U.S. Pat. No: 5,423,684 and No. 5,469,050.

Examples of switchgear assemblies and components associated therewith which may be used in conjunction with the present invention can be found in the following U.S. Pat. No: 5,449,056; No. 5,466,973; No. 5,466,974; No. 5,394,134; No. 5,477,017; No. 5,418,328; No. 5,362,933; and No. 5,101,080.

The following are examples of systems and components with which the present invention may be utilized: U.S. Pat. No. 5,650,902; U.S. Pat. No. 4,697,873; U.S. Pat. No. 3,675,079; U.S. Pat. No. 4,184,186; U.S. Pat. No. 4,685,018; U.S. Pat. No. 5,590,012; U.S. Pat. No. 5,206,596; U.S. Pat. No. 4,685,018; U.S Pat. No. 4,461,571; U.S. Pat. No. 4,376,243; U.S. Pat. No. 4,177,404; U.S. Pat. No. 3,949,232; and U.S. Pat. No. 3,749,877.

Examples of optical devices and components associated therewith which may be used in conjunction with the present invention can be found in the following U.S. Pat. No: 5,463,708; No. 5,408,551; No. 5,414,819; and No. 5,379,362.

The components disclosed in the various publications, disclosed or incorporated by reference herein, may be used in the embodiments of the present invention, as well as, equivalents thereof.

The appended drawings in their entirety, including all dimensions, proportions and/or shapes in at least one embodiment of the invention, are accurate and to scale and are hereby included by reference into this specification.

All, or substantially all, of the components and methods of the various embodiments may be used with at least one embodiment or all of the embodiments, if more than one embodiment is described herein.

All of the patents, patent applications and publications recited herein, and in the Declaration attached hereto, are hereby incorporated by reference as if set forth in their entirety herein.

The corresponding foreign and international patent publication applications, namely, Federal Republic of Germany Patent Application No. 295 05 362.3, filed on Mar. 30, 1995, and PCT/DE96/00543, filed on Mar. 28, 1996, having inventors Andreas Schumacher and Perenc Boros, and DE-OS 295 05 362.3, DE-PS 295 05 362.3 and WO 96/30987 which published on Oct. 3, 1996, as well as their published equivalents, and other equivalents or corresponding applications, if any, in corresponding cases in the Federal Republic of Germany and elsewhere, and the references cited in any of the documents cited herein, are hereby incorporated by reference as if set forth in their entirety herein.

The details in the patents, patent applications and publications may be considered to be incorporable, at applicant's option, into the claims during prosecution as further limitations in the claims to patentably distinguish any amended claims from any applied prior art.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clause are intended to cover the structures described herein as performing the recited function and not only structural equivalents but also equivalent structures.

The invention as described hereinabove in the context of the preferred embodiments is not to be taken as limited to all of the provided details thereof, since modifications and variations thereof may be made without departing from the spirit and scope of the invention.

What is claimed is:

1. An electrical power distribution switching arrangement having input and output for power and contacts to interrupt the power from the input to the output, such as a substation for the distribution of electrical power, said arrangement having at least one possible location for the inadvertent generation of an arc, said arrangement comprising:

a device for receiving electrical power from at least one source;

a device for outputting electrical power to at least one destination;

a device for delivering electrical power from said receiving device to said outputting device;

a device for detecting and extinguishing an arc that has been inadvertently generated within said arrangement;

said detecting device comprising:

at least one light guide to transmit light of an arc generated in said arrangement;

a support member;

said at least one light guide being disposed on said support member;

a sleeve being fitted over said at least one light guide and said support member to prevent damage to said at least one light guide; and said sleeve being permeable to light and UV radiation to permit light of an arc to reach said at least one light guide.

2. The arrangement according to claim 1 wherein said sleeve comprises a heat-shrink sleeve.

3. The arrangement according to claim 2 wherein said at least one light guide is wound helically around said support member.

4. The arrangement according to claim 3 wherein said support member is flexible.

5. An apparatus for detecting accidental arcs in electric power distribution switching equipment, the electric power distribution switching equipment having at least one possible location for the inadvertent generation of an arc, said apparatus comprising:
- at least one optical waveguide to transmit and detect the light of an arc inadvertently generated in the power distribution switching equipment;
- said at least one optical waveguide for being disposed adjacent to the at least one possible location for the inadvertent generation of the arc;
- a support rod, said support rod having a first end and a second end;
- said at least one optical waveguide being wound helically around said support rod;
- a first connector disposed at said first end of said support rod;
- a second connector disposed at said second end of said support rod;
- said first connector and said second connector both being disposed and configured for connection to an optoelectronic device;
- a sleeve, said sleeve comprising a material permeable to light and to UV radiation; and
- said sleeve being fitted over said optical waveguide, said support rod and said first and second connectors to prevent damage to said at least one optical waveguide.

6. The apparatus according to claim 5 wherein said sleeve comprises a heat-shrink sleeve.

7. The apparatus according to claim 6 wherein each of said first connector and said second connector comprises a cavity configured for receiving one of said first end and said second end of said support rod, said first end of said support rod being disposed in said first cavity and said second end of said support rod being disposed in said second cavity.

8. The apparatus according to claim 7 wherein:
- said cavities of each of said first part and said second part are first cavities;
- each of said first connector and said second connector comprises:
  - a first part, said first part comprising said first cavity;
  - a second part disposed adjacent said first part and adjacent said second end of said second end of said first and second connector;
  - said second part comprising a second cavity extending from said first cavity; and
  - said optical waveguide extending into said second cavity.

9. The apparatus according to claim 8 wherein:
- said support rod has a longitudinal axis;
- each of said first connector and said second connector have a first end and a second end;
- said first end of said first connector being disposed immediately adjacent said first end of said support rod;
- said first end of said second connector being disposed immediately adjacent said second end of said support rod;
- each of said first parts of said first connector and said second connector have an outer diameter perpendicular to the longitudinal axis of said support rod;
- each of said second parts of said first connector and said second connector have an outer diameter perpendicular to the longitudinal axis of said support rod, said outer diameters of said second parts being substantially less than said diameters of said first parts;
- said second cavities of each of said second parts have a plurality of diameters perpendicular to the longitudinal axis of said support rod;
- said plurality of diameters of said second cavities each including a maximum diameter and a minimum diameter, said maximum diameter being disposed adjacent said first cavity of said first part;
- said minimum diameter being disposed adjacent said second end of said first connector and said second connector;
- said optical waveguide having a diameter perpendicular to the longitudinal axis of said support rod; and
- said minimum diameter of said second cavities being approximately equal to the diameter of said optical waveguide.

10. The apparatus according to claim 9 wherein:
- said support rod comprises an outer surface and a center disposed at said longitudinal axis of said support rod;
- said first end of said support rod comprises a boring extending at an angle from said outer surface towards said center of said support rod and towards said first connector;
- said optical waveguide being disposed within said boring of said first end and extending into said first connector and being parallel to and centered in relation to said support rod.

11. The apparatus according to claim 10 wherein said support rod is flexible.

12. An apparatus for detecting accidental arcs in electric power distribution switching equipment, the electric power distribution switching equipment having at least one possible location for the inadvertent generation of an arc, said apparatus comprising:
- at least one light guide to transmit light of an arc generated in the electric power distribution switching equipment;
- a support member;
- said at least one light guide being disposed on said support member;
- an arrangement to connect said light guide to an optoelectronic device;
- a sleeve being fitted over said light guide and said support member; and
- said sleeve comprising a material permeable to light and UV radiation to permit light of an arc to reach said light guide.

13. The apparatus according to claim 12 wherein said sleeve is fitted over said light guide and said support member to hold said light guide in a substantially fixed position adjacent said support member and to protect said light guide from damage.

14. The apparatus according to claim 13 wherein said sleeve comprises a heat-shrink sleeve.

15. The apparatus according to claim 14 wherein said light guide is helically wound around said support member.

16. The apparatus according to claim 15 wherein:
- said support member has a first end and a second end disposed opposite one another;
- said arrangement to connect comprises a first connector disposed at said first end of said support member and a second connector disposed at said second end of said support member; and said first connector and said second connector are configured and disposed for connection to an optoelectronic device.

17. The apparatus according to claim 16 wherein:

said support member is flexible;

said first connector and said second connector comprises a cavity configured for receiving one of said first end and said second end of said support member, said first end of said support member being disposed in said first cavity and said second end of said support rod being disposed in said second cavity;

said cavities of each of said first part and said second part are first cavities;

each of said first connector and said second connector comprises:
 a first part, said first part comprising said first cavity;
 a second part disposed adjacent said first part and adjacent said second end of said second end of said first and second connector;
 said second part comprising a second cavity extending from said first cavity; and
 said optical waveguide extending into said second cavity.

18. The apparatus according to claim 17 wherein:

said support member has a longitudinal axis;

each of said first connector and said second connector have a first end and a second end;

said first end of said first connector is disposed immediately adjacent said first end of said support member; and said first end of said second connector is disposed immediately adjacent said second end of said support member.

19. The apparatus according to claim 18 wherein:

each of said first parts of said first connector and said second connector have an outer diameter perpendicular to the longitudinal axis of said support member;

each of said second parts of said first connector and said second connector have an outer diameter perpendicular to the longitudinal axis of said support member, said outer diameters of said second parts being substantially less than said diameters of said first parts;

said second cavities of each of said second parts have a plurality of diameters perpendicular to the longitudinal axis of said support member;

said plurality of diameters of said second cavities each including a maximum diameter and a minimum diameter, said maximum diameter being disposed adjacent said first cavity of said first part;

said minimum diameter being disposed adjacent said second end of said first connector and said second connector;

said optical waveguide having a diameter perpendicular to the longitudinal axis of said support member; and said minimum diameter of said second cavities being approximately equal to the diameter of said optical waveguide.

20. The apparatus according to claim 19 wherein:

said support member comprises an outer surface and a center disposed at said longitudinal axis of said support member;

said first end of said support member comprises a boring extending at an angle from said outer surface towards said center of said support member and towards said first connector;

said optical waveguide is disposed within said boring of said first end and extending into said first connector and being parallel to and centered in relation to said support member.

* * * * *

UNITED STATES PATENT AND TRADEMARK OFFICE
CERTIFICATE OF CORRECTION

PATENT NO. : 5,940,547
DATED : August 17, 1999
INVENTOR(S) : Andreas SCHUMACHER and Ferenc BOROS It is certified that error appears in the above-identified patent and that said Letters Patent is hereby corrected as shown below:

In column 5, line 8, after 'cavity', delete "B" and insert --8--.

In column 6, line 9, after the first occurrence of 'and', delete "Perenc" and insert --Ferenc--.

Signed and Sealed this

Eighteenth Day of July, 2000

*Attest:*

Q. TODD DICKINSON

*Attesting Officer*    *Director of Patents and Trademarks*